United States Patent [19]

Seabaugh

[11] Patent Number: 5,179,037
[45] Date of Patent: Jan. 12, 1993

[54] INTEGRATION OF LATERAL AND VERTICAL QUANTUM WELL TRANSISTORS IN THE SAME EPITAXIAL STACK

[75] Inventor: Alan C. Seabaugh, Richardson, Tex.

[73] Assignee: Texas Instruments Incorporated, Dallas, Tex.

[21] Appl. No.: 814,966

[22] Filed: Dec. 24, 1991

[51] Int. Cl.[5] ................ H01L 21/328; H01L 21/335; H01L 21/72
[52] U.S. Cl. .................................... 437/59; 437/31; 437/40; 437/133
[58] Field of Search ................ 437/51, 54, 59, 107, 437/133, 40, 31; 357/41, 43

[56] References Cited

U.S. PATENT DOCUMENTS

| | | | |
|---|---|---|---|
| 4,712,121 | 12/1987 | Yokoyama | 357/4 |
| 4,758,868 | 7/1988 | Frijlink | 357/16 |
| 4,758,870 | 7/1988 | Hase et al. | 357/34 |
| 4,783,427 | 11/1988 | Reed et al. | 437/90 |
| 4,860,064 | 8/1989 | Luryi | 357/12 |
| 4,889,831 | 12/1989 | Ishii et al. | 437/184 |
| 5,012,301 | 4/1991 | Xu et al. | 357/4 |
| 5,012,318 | 4/1991 | Honjo | 357/43 |
| 5,077,231 | 12/1991 | Plumton et al. | 437/51 |

FOREIGN PATENT DOCUMENTS 0226383 6/1987 European Pat. Off. .

OTHER PUBLICATIONS

Karunasim, R., et al., "Quantum Devices using SiGe/Si ...", *J. Vac. Sci. Technol. B.* 9(4), Jul./Aug. 1991, pp. 2064–2071.
Seabaugh, A., et al., "Room Temperature Hot Electron Transistors ...", *Japanese J. Applied Physics*, vol. 30, No. 5, May 1991, pp. 921–925.
Yang, C., et al., "New field-effect resonant tunnelling transistor ...", *Appl. Phys. Lett.*, 55(26), Dec. 25, 1989, pp. 2742–2744.
Beltram, F., et al., "Negative-transconductance via gating of the quantum well ...", *Appl. Phys. Lett.*, 53(3), Jul. 18, 1988, pp. 219–221.
Broekaert, T., et al., "Extremely high current ... Pseudomorphic In$_{0.53}$Ga$_{0.47}$As/AlAs/InAs Resonant Tunneling Diodes", *IEEE IEDM Tech. Digest, 1989, pp. 559–562*.
Broekaert, T., et al., "AlAs etch-stop layers for InGaAlAs/InP Heterostructure Devices and Circuits", *IEEE IEDM Tech. Digest*, 1989, pp. 339–342.
Broekaert, T. et al., "Pseudomorphic In$_{0.53}$Ga$_{0.47}$As/AlAs/InAs Resonant Tunneling Diodes", *Appl. Phys. Lett.*, 53(16), Oct. 17, 1988, pp. 1545–1547.
Chow, S. et al., "Lateral Resonant Tunneling Transistors Employing Field-Induced Quantum Wells and Barriers", *Proceedings of the IEEE*, vol. 79, No. 8, Aug. 1991, pp. 1131–1139.
Huang, Q. et al., "Analysis of n-Channel MOS-Controlled Thyristors", *IEEE Trans. Electron Devices*, vol. 38, No. 7, Jul. 1991, pp. 1612–1618.
Ide, Y., et al., "Sidewall Growth by Atomic Layer Epitaxy", *Appl. Phys. Lett.*, 53(23), Dec. 5, 1988, pp. 2314–2316.
Seabaugh, A., et al., "Pseudomorphic Bipolar Quantum Resonant-Tunneling Trans.", *IEEE Trans. Electron Devices*, vol. 36, No. 10, Oct. 1989, pp. 2228–2234.
Seabaugh, A., et al., "Quantum-Well Resonant-Tunneling Transistors", *Twelfth Biennial Conf. Adv. Concept High Speed Semiconductor Devices and Circuits*, Aug. 7, 8, 9, 1989, Cornell Univ., pp. 1–10.
Yamamoto, T., et al., "Buried Rectangular GainAs/InP ... by OMVPE", *Electronics Letters*, Jun. 21, 1990, vol. 26, No. 13, pp. 875–876.

*Primary Examiner*—T. Quach
*Attorney, Agent, or Firm*—Richard A. Stoltz; Richard L. Donaldson; Jay M. Cantor

[57] ABSTRACT

An epitaxial stack (10) is provided that allows integration of both vertical and horizontal quantum effect devices. Epitaxial stack (10) allows fabrication of both quantum well resonant tunneling transistors (27) and Stark-effect transistors (34), thus allowing for circuit integration of different quantum effect devices in the same epitaxial stack.

5 Claims, 3 Drawing Sheets

INTEGRATION OF LATERAL AND VERTICAL QUANTUM WELL TRANSISTORS IN THE SAME EPITAXIAL STACK

NOTICE

The U.S. Government has a paid-up license in this invention and the right in limited circumstances to require the patent owner to license others on reasonable terms as provided for by the terms of Contract No. N00014-90-C-0161.

TECHNICAL FIELD OF THE INVENTION

This invention relates generally to the field of electronic devices, and more particularly to the integration of different quantum effect devices in the same epitaxial stack.

RELATED APPLICATIONS

This application is related to application Ser. No. 07/567,847 filed Aug. 15, 1990 now abandoned.

BACKGROUND OF THE INVENTION

One measure of the power and utility of integrated circuits is the functional density of electronic devices. The value of integrated circuits is frequently directly dependent upon that functional density. Consequently, substantial efforts are expended in search of ways to downscale the size of electronic devices. In recent years, the development of "nanoelectronics" has promised substantial reductions in device geometries.

In practice, however, nanoelectronics (which make use of the quantum effects of charge carriers) have not been widely implemented for the very reason that they may be so valuable: their size. Conventional fabrication techniques have simply been unable to produce practically usable integrated circuits implementing quantum effect devices. The necessarily small size of quantum effect devices makes their fabrication under conventional techniques difficult. Another significant limitation associated with quantum effect devices is the frequent requirement that they be operated at low temperatures.

Very recently, however, quantum effect devices that overcome many of these barriers to practical use have been disclosed. For example, Yang, Kao, and Shih have disclosed a Stark-effect transistor in their paper "New Field-Effect Resonant Tunneling Transistor: Observation Of Oscillatory Transconductance," *Appl. Phys. Lett.*, 55(26), Dec. 25, 1989, pp. 2742–2744. As another example, room temperature operation of resonant-tunneling hot electron transistors has been disclosed in "Room Temperature Hot Electron Transistors With InAs-Notched Resonant-Tunneling-Diode Injector," *Japanese Journal of Applied Physics.* Vol. 30, No. 5, May 1991, pp. 921–925 by Seabaugh, Kao, Randall, Frensley, and Khatibzadeh.

While these recent developments in nanoelectronics have allowed for practically usable devices, no structure has yet been disclosed that allows for different kinds of quantum effect devices to be fabricated in the same epitaxial stack. This integration is desirable as each transistor has its own unique advantage: the horizontal transistor, for its low power consumption, multiple negative transconductance characteristic, and high functional density, and the vertical transistor for its high current density and high speed of operation. Therefore, a need has arisen for an epitaxial stack that allows for integration of different types of nanoelectronic quantum effect devices.

SUMMARY OF THE INVENTION

An epitaxial structure is provided which allows for integration of different kinds of quantum effect devices in the same integrated circuit. In a preferred embodiment of the present invention, both Stark-effect transistors (horizontal transistors) and quantum well resonant tunneling transistors (vertical transistors) may be fabricated in the same epitaxial stack, thus allowing for integrated circuits using both transistors.

An important technical advantage of the present invention inheres in the fact that one epitaxial stack allows different quantum effect devices to be integrated. Thus, circuits that make use of different quantum effect devices may be integrated in the same epitaxial stack. Another important technical advantage of the present invention inheres in the fact that lateral transistors, such as Stark-effect transistors may be formed through the face of an epitaxial stack, such that the back gate may be accessed from the same side as the front gate.

BRIEF DESCRIPTION OF THE DRAWINGS

A more complete understanding of the present invention may be acquired by referring to the detailed description and claims considered in connection with the accompanying drawings, in which like reference numbers indicate like features and wherein:

FIG. 2b is an energy band profile of the transistor shown in FIG. 2a;

FIG. 3b is an energy band profile of the transistor shown in FIG. 3a;

DETAILED DESCRIPTION OF THE DRAWINGS

Figure 1:
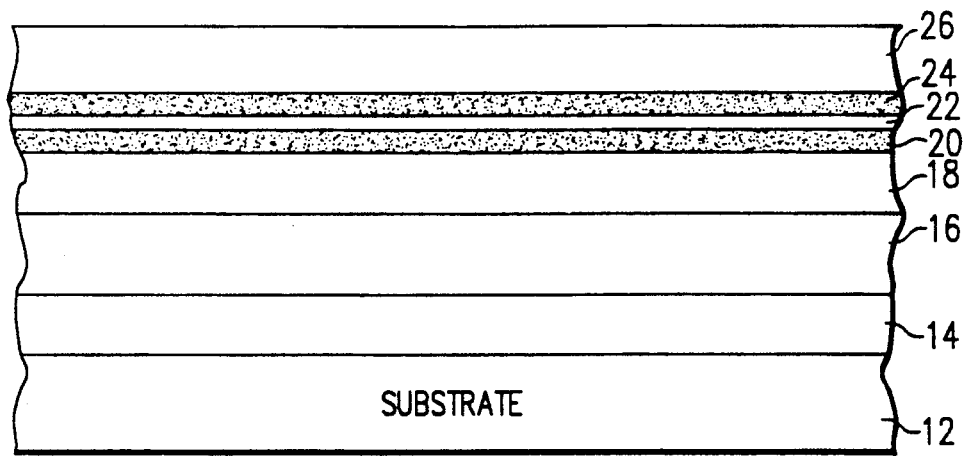
FIG. 1 is a cross-sectional schematic of an epitaxial stack constructed according to the teachings of the present invention in which different quantum effect devices may be fabricated.

FIG. 1 is a schematic cross-sectional representation of an epitaxial stack, indicated generally at 10, that allows for integration of different quantum effect devices according to the present invention. Because a vertical quantum well resonant tunneling transistor such as that shown in FIG. 2 (to be discussed later) may be formed of an epitaxial stack 10, the semiconductor layers comprising epitaxial stack 10 are given descriptive names associated with the device shown in FIG. 2. These descriptive names are merely for purposes of teaching the present invention.

Epitaxial stack 10 comprises a plurality of semiconductor layers overlaying a semiconductor substrate 12. Substrate 12 may comprise a semi-insulating layer of indium phosphide. Other possible substrates that can be used for the invention are silicon, gallium arsenide, indium arsenide, cadmium telluride, germanium, gallium phosphide, gallium antimonide and aluminum antimonide. The selection of the substrate material will determine the heterojunction systems that can be used, since other semiconductor layers must be lattice-matched or pseudomorphic to substrate 12. The term "pseudomorphic" refers to a layer under strain with its natural lattice constant constrained to that of the substrate.

A relatively conductive subcollector layer 14 is grown on substrate 12. Where substrate 12 is indium phosphide (as is hereinafter assumed), subcollector 14 may be a ternary semiconductor such as indium gallium arsenide. Collector layer 16 is grown over subcollector layer 14. Before growing collector layer 16, a thin graded layer (not illustrated) may be grown over subcollector layer 14 as a transition between collector layer 16 and subcollector layer 14. The composition of such a graded layer varies continuously between the chemical compositions of subcollector layer 14 and collector layer 16. Collector layer 16 may be formed of a quarternary semiconductor, such as indium aluminum gallium arsenide, for example. A quantum layer 18 is grown over collector layer 16, and may be formed of a ternary semiconductor material such as indium gallium arsenide. Furthermore, quantum layer 18 is doped to allow for conductance, and may be doped to a concentration of $1 \times 10^{18}$ cm$^{-3}$.

A thin, high band gap barrier layer 20 is then grown to overlie quantum layer 18. Barrier layer 20 may be formed of a binary semiconductor such as aluminum arsenide. A quantum injection well layer 22 is then grown overlying barrier layer 20 and may comprise a ternary semiconductor such as indium gallium arsenide. Barrier layer 24 is then grown overlying quantum injection well layer 22 and may comprise a binary semiconductor such as aluminum arsenide. Quantum injection well layer 22 may comprise three unillustrated layers. In such a case, a thin "notch" layer of a semiconductor material such as indium arsenide can be grown between two layers of relatively low band gap semiconductor material, such as indium gallium arsenide As those skilled in the art will recognize, the term "band gap" refers to the difference between the valence band energy and the conduction band energy of a given material. When it is said that a material has a higher band gap than another, it is meant that conduction band energy of the higher band gap material is greater than that of the lower band gap material.

Emitter layer 26 is grown to overlie barrier layer 24. Emitter layer 26 may be formed of a ternary semiconductor material such as indium gallium arsenide, and should be doped with an n-type impurity to render it conductive, such as a concentration of $5 \times 10^{18}$ cm$^{-3}$ if silicon is used. Emitter layer 26 may also comprise three distinct layers (unillustrated). In such a case, the bottommost layer of emitter layer 26 is formed of undoped semiconductor material such as indium gallium arsenide, and the middle layer is formed of a semiconductor material such as indium gallium arsenide doped with n-type impurity. Overlying that middle layer is an emitter cap layer grown of a semiconductor material such ad indium gallium arsenide doped with an n-type impurity to a concentration such as $5 \times 10^{18}$ cm$^{-3}$, if silicon is used, for example.

A principal advantage of the invention is that different quantum effect devices may be integrated into the same epitaxial stack shown in FIG. 1. For example, a quantum well resonant tunneling transistor such as that shown in FIG. 2 and a Stark-effect transistor such as that shown in FIG. 3 may both be formed in epitaxial stack 10.

Figure 2B:
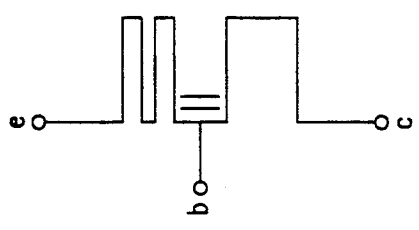
Figure 2A:
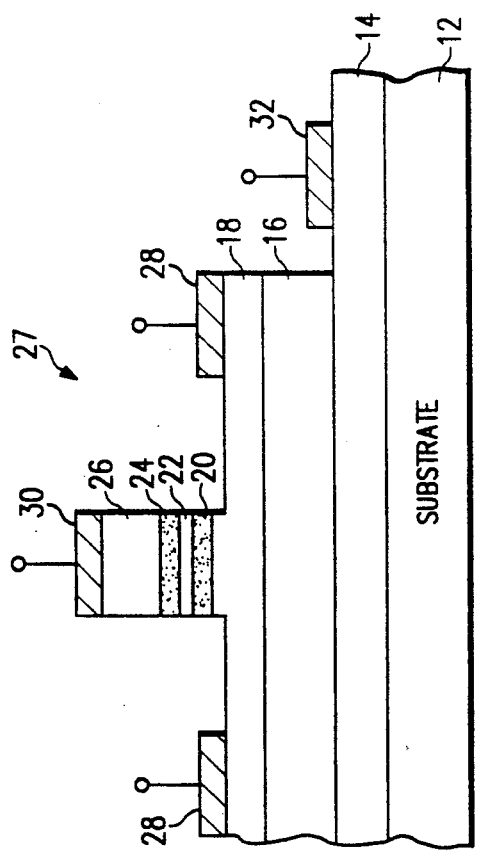
FIG. 2a is a schematic cross-sectional diagram of a vertical quantum well resonant tunneling transistor fabricated in the epitaxial stack shown in FIG. 1.

FIG. 2a illustrates a quantum well resonant tunneling transistor indicated generally at 27. To fabricate transistor 27 in epitaxial stack 10, base contacts 28, emitter contact 30, and collector contact 32 are ohmically contacted to quantum layer 18, emitter layer 26, and subcollector layer 14, respectively. Base contacts 28 are contacted to quantum layer 18 after etching through emitter layer 26, barrier layers 24 and 20, and quantum injection well layer 22. Etching downwardly to quantum layer 18 may be performed by using standard photolithographic techniques or electron beam lithography, followed by a wet chemical etch, such as a selective etch using succinic acid. Likewise, collector contact 32 may be ohmically contacted to subcollector 14 after etching through to subcollector layer 14 with an etch such as sulfuric acid, hydrogen peroxide, and water. The ohmic contact for base contacts 28, emitter contact 30, and collector contact 32 may be formed by a nonalloyed metal/semiconductor contact, for example.

FIG. 2b is an energy band profile of transistor 27. As shown in FIG. 2b, the bandgaps for barrier layers 24 and 20, and for collector layer 16 are high with respect to emitter layer 26, quantum injection well layer 22, quantum layer 18, and subcollector layer 14. Collector layer 16 typically has a bandgap less than or equal to the barrier layers 20 and 24, and greater than the quantum layer 18. Base, emitter, and collector contacts are also indicated in FIG. 2b.

Figure 3B:
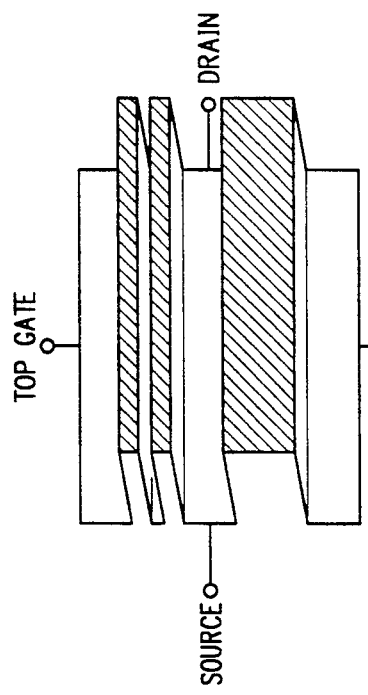
Figure 3A:
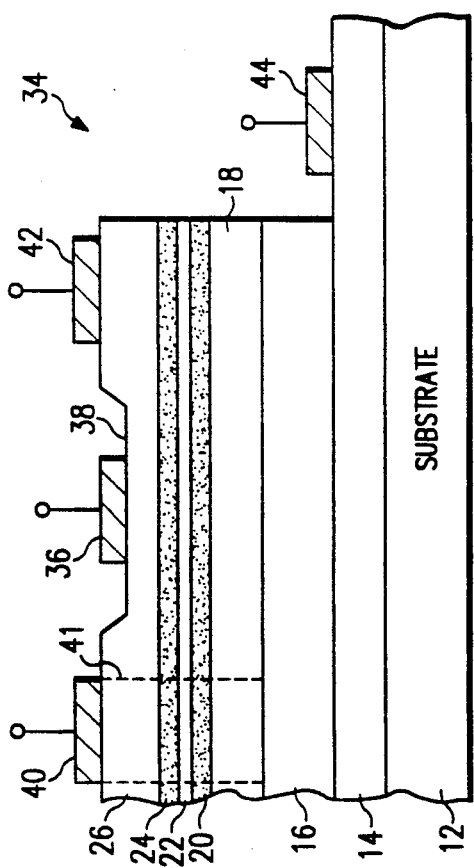
FIG. 3a is a schematic cross-sectional representation of a Stark-effect transistor fabricated in the epitaxial stack shown in FIG. 1.

Referring now to FIG. 3a, a schematic cross-sectional representation of a Stark-effect transistor 34 fabricated in an epitaxial stack such as that shown in FIG. 1. Stark-effect transistor 34 is fabricated by using an etch process, such as discussed above, to etch a groove 38 into emitter layer 26 so as to allow for connection of front gate contact 36. Likewise, an etch is used to etch down one side of Stark-effect transistor 34 to subcollector layer 14 to allow for connection of a back gate 44. Source contact 40 and drain contact 42 are connected on opposite sides and adjacent to front gate 36 so as to form Stark-effect transistor 34's source and drain. Source region 41 (indicated by the dashed outline) is formed by implanting semiconductive impurities, such as silicon, under source contact 40 through to quantum layer 18. Alternatively, region 41 can be formed by diffusion of dopants from an alloyed contact metal.

FIG. 3b is an energy profile of transistor 34. As shown in FIG. 3b, the bandgaps for barrier layers 24 and 20, and for collector layer 16 are high with respect to emitter layer 26, quantum injection well layer 22, quantum layer 18, and subcollector layer 14. Source, gate, drain, and back gate contacts are also indicated in FIG. 3b. The channel between the source and drain contacts is formed along the low-band gap quantum well layer 18.

Figure 4:
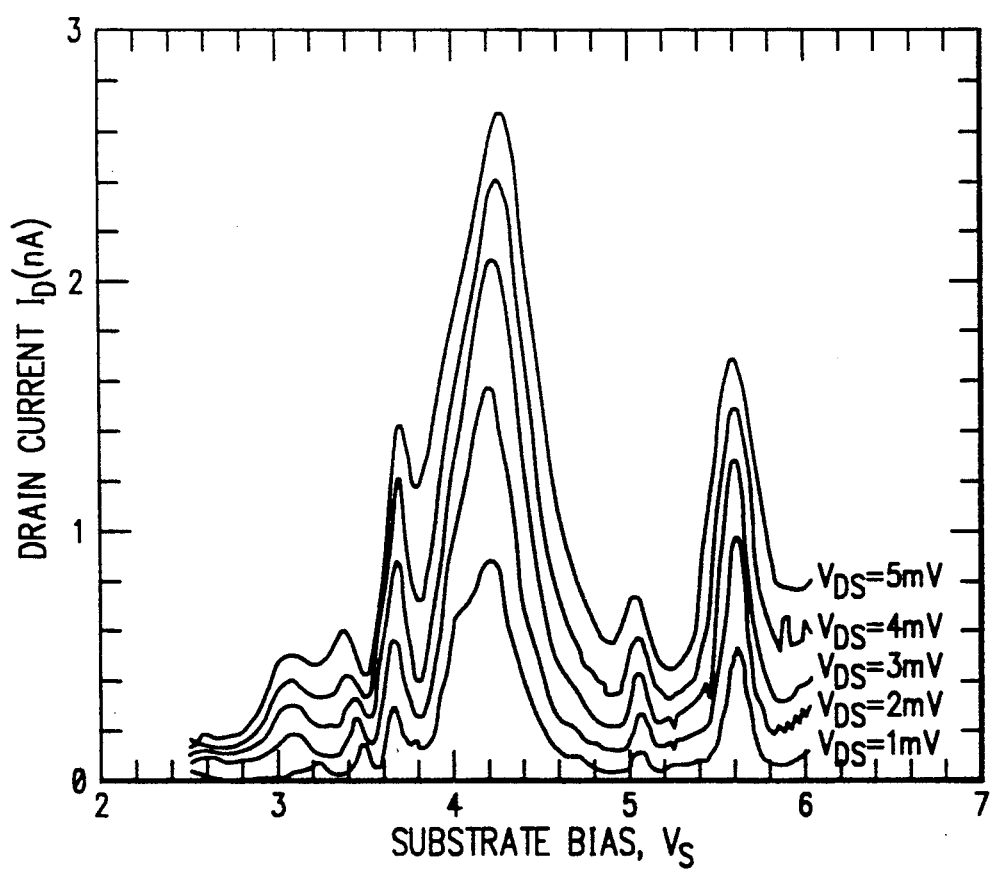
FIG. 4 is a graph of drain current for the horizontal transistor such as is shown in FIG. 3 as a function of substrate (back gate) bias and drain-source bias.

The operation of transistors like Stark-effect transistor 34 has been generally described in a paper by Yang, Kao, and Shih entitled "New Field-Effect Resonant Tunneling Transistor: Observation of Oscillatory Transconductance," *Appl. Phys. Lett.*, 55(26), 25 December 1989, pp. 2742-2744. FIG. 4 has been included to illustrate the multiple negative differential transconductance characteristics of quantum transistors such as the Stark-effect transistor 34 fabricated within epitaxial stack 10. FIG. 4 represents a graph of the drain current flowing in transistor 34 as a function of the substrate bias (back gate voltage bias). In FIG. 4, drain current has been represented for drain-source biases from 1 to 5 millivolts. Multiple negative transconductances in the drain current are observed as substrate bias is increased, consequently affecting the injections of current through quantum injection well layer 22 and into the two-dimensionally quantized layer 18.

Although reference has been made to the paper by Yang, Kao, and Shih for purposes of describing the operation of a Stark-effect transistor, an important technical advantage of the present invention inheres in the fact that a Stark-effect transistor may be fabricated in epitaxial stack 10, which is a different epitaxial stack than that disclosed in the paper by Yang, et al. As shown in FIG. 3a, transistor 34 is formed over semiconductor substrate 12, such that back gate 44 may be connected through the surface of epitaxial stack 10. Such a connection facilitates integration of the Stark-effect transistor with other devices formed in epitaxial stack 10.

Figure 5A:
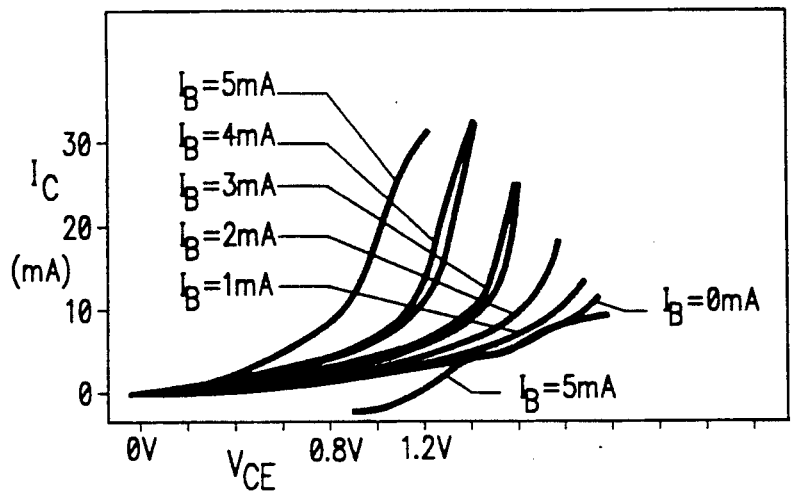
FIGS. 5a and 5b are graphs of the collector current for the device shown in FIG. 2 as a function of base-emitter and collector emitter bias.
Figure 5B:
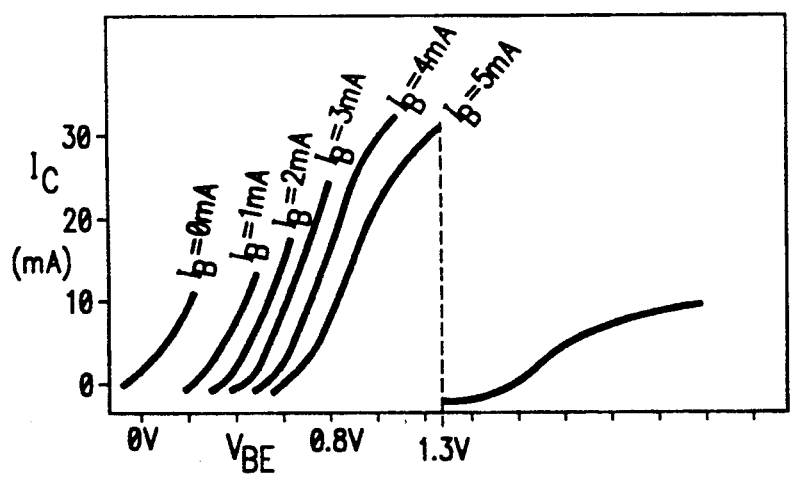

The operation of quantum well resonant tunneling transistor 27 is described generally in the paper by Seabaugh, Kao, Randall, Frensley, and Khatibzateh entitled "Room Temperature Hot Electron Transistors With InAs-Notched Resonant-Tunneling-Diode Injector," *Japanese Journal of Applied Physics*, Vol. 30, No. 5, May 1991, pp. 921–925, and related U.S. patent application No. 07/567,847, filed Aug. 15, 1990. FIGS. 5a and 5b of the present invention are included to illustrate the characteristics of transistor 27 of FIG. 2a. As can be seen from FIG. 5a, collector/base leakage gives rise to non-zero collector current, $I_c$, for the first base current step, corresponding to $I_B = 0$. For the fifth base current step, $I_B = 5$ mA, the collector current is discontinuous at $V_{CE} = 1.2$ volts. This is the point at which resonance is experienced in quantum injection well layer 22. Referring to FIG. 5b, at $V_{BE} = 1.3$ volts, the injector is switched out of resonance. When this occurs, the base/emitter voltage $V_{BE}$ increases, causing the collector/base junction to switch to a weak forward bias. This manifests itself as a negative collector current in the off resonance condition and is seen in both FIGS. 5a and 5b. The collector current switches from a value of 27 mA at $V_{CE} = 1.2$ volts to negative 1.5 mA at about a value of 0.9 volts due to this forward-biasing of the collector/base junction.

Those skilled in the art will recognize that the semiconductor layers comprising epitaxial stack 10 described in connection with FIG. 1 have been particularly described for purposes of teaching the present invention. Other semiconductor materials may be used to form each of the layers without departing from the teachings of the present invention. Furthermore, gradation layers and dopant spacer layers may be inserted between each of the semiconductor layers described in connection with epitaxial stack 10 to provide transitions between each layer In summary, an epitaxial stack is disclosed which allows for fabrication of both vertical and lateral quantum-effect transistors. By providing an epitaxial stack that allows for fabrication of different quantum effect devices, the practical utility of quantum effect devices may be greatly increased. With the epitaxial stack as disclosed by the present invention, a wide range of integrated circuit functions may be realized, since multiple quantum effect devices may be integrated in the same integrated circuit.

Although the present invention has been described in detail, it should be understood that various changes, substitutions and alterations can be made hereto without departing from the spirit and scope of the invention as defined by the appended claims.

What is claimed is:

1. A method of forming an integrated circuit including a Stark-effect transistor and a resonant tunneling transistor using a single epitaxial stack, comprising the steps of:

forming a semi-insulating substrate;

forming a subcollector layer on the semi-insulating substrate having a relatively low band gap between conduction and valence bands;

forming a collector layer having a relatively high band gap with respect to the subcollector layer to overlie the subcollector layer;

forming a quantum well layer having a relatively low band gap with respect to the collector layer to overlie the collector layer;

forming a first injection barrier layer having a relatively high band gap with respect to the collector layer to overlie the quantum well layer;

forming a quantum injection well layer having a relatively low band gap with respect to the first injection barrier layer to overlie the first injection barrier layer;

forming a second injection barrier layer having a relatively high band gap with respect to the quantum injection well layer to overlie the quantum injection well layer;

forming an emitter layer having a relatively low band gap with respect to the second injection barrier layer to overlie the second injection barrier layer;

the subcollector layer, the collector layer, the quantum well layer, the first injection barrier layer, the quantum well injection layer, the second injection barrier layer and the emitter layer forming an epitaxial stack;

defining a quantum well resonant tunneling transistor area and a separate Stark-effect transistor area on the stack;

etching the emitter layer, the second injection barrier layer, the quantum injection well layer and the first injection barrier layer within the resonant tunneling transistor area to expose the quantum well layer;

forming a base contact within the resonant tunneling transistor area to the quantum well layer;

forming a collector contact within the resonant tunneling transistor area to the subcollector layer;

forming a source contact within the Stark-effect transistor area to overlie and to be conductively coupled to the quantum well layer;

forming a gate contact within the Stark-effect transistor area and spaced from the source contact to overlie and to be conductively coupled to the emitter layer and decoupled from the source contact and a drain contact;

forming the drain contact within the Stark-effect transistor area and spaced from the gate contact opposite the source contact to overlie and to be conductively coupled to the emitter layer; and forming a back gate contact within the Stark-effect transistor area to the subcollector area.

2. The method of claim 1 and further comprising the step of introducing dopants under the source contact, such that a conductive path is formed from the source contact to the quantum well layer.

3. The method of claim 1 and further comprising the step of etching a groove into the emitter layer in the Stark-effect transistor area between the source and drain contacts, said step of forming a gate contact comprising forming the gate contact in the groove.

4. The method of claim 1, wherein said step of forming a base contact further comprises forming the base contact to the quantum well layer to surround the first injection barrier, the quantum injection well, the second injection barrier and the emitter.

5. The method of claim 1, wherein the step of forming a quantum injection well layer further comprises forming a notch layer between two conducting layers.

* * * * *